March 24, 1970 H. HENKER 3,502,516

METHOD FOR PRODUCING PURE SEMICONDUCTOR MATERIAL FOR ELECTRONIC PURPOSES

Filed Oct. 20, 1965 2 Sheets-Sheet 1

March 24, 1970 H. HENKER 3,502,516

METHOD FOR PRODUCING PURE SEMICONDUCTOR MATERIAL FOR ELECTRONIC PURPOSES

Filed Oct. 20, 1965 2 Sheets-Sheet 2

United States Patent Office 3,502,516
Patented Mar. 24, 1970

3,502,516

METHOD FOR PRODUCING PURE SEMICONDUCTOR MATERIAL FOR ELECTRONIC PURPOSES

Heinz Henker, Munich, Germany, assignor to Siemens Aktiengesellschaft, a corporation of Germany Filed Oct. 20, 1965, Ser. No. 498,666
Claims priority, application Germany, Nov. 6, 1964, S 94,061
Int. Cl. H01l 7/36
U.S. Cl. 148—175 15 Claims

ABSTRACT OF THE DISCLOSURE

Method of producing semiconductor material for electronic purposes by precipitating it from a reaction gas comprising a mixture of gaseous compound of a semiconductor element and carrier gas upon a substrate having its crystalline structure laid bare and having its surface contacted by the flowing gas mixture in a processing vessel whose walls are kept at a lower temperature than the substrate includes providing a substrate having a specific electric resistance of at most 0.1 ohm-cm., heating the substrate by high frequency inductive heating to a temperature below the melting point of the semiconductor element yet sufficiently high to effect deposition of the semiconductor element from the gas phase onto the surface of the substrate, and adjusting the composition of the reaction gas so that throughout the deposition process the temperaautre at which the rate of deposition is at a maximum is below the temperature to which the surface of the substrate is heated, and the temperature to which the surface of the substrate is heated lies in a temperature range wherein the rate of deposition decreases with increasing temperature at a constant rate.

My invention relates to a method of producing hyperpure silicon or other semiconductor material with or without added dopant, suitable for electronic purposes by thermal dissociation and/or reduction of a gaseous semiconductor compound.

According to a known method of producing monocrystalline semiconductor material, particularly silicon, by precipitation from the gaseous phase onto a heated carrier, a crystalline substrate having its crystalline structure laid bare by suitable pre-treatment such as etching, is heated to a temperature below the one at which the maximal precipitation of the semiconductor material takes place. During the process, the reaction gas is passed about the substrate surface, preferably in turbulence. The heating of the substrate is effected by directly passing electric current therethrough, or by high-frequency induction, or by heat radiation. Due to the temperature distribution occurring within the substrate, a uniform formation of the epitaxially grown monocrystalline layer is obtained. To keep this layer as free as feasible of crystalline faults, the substrate must consist of a material whose purity and consequently specific electrical resistance is very high. Otherwise, a considerable amount of diffusion of the impurities from the substrate into the grown layer will take place. This danger of disturbing diffusion is suggestive of operation at lowest feasible temperatures. This is the reason why the process has been performed at a temperature below that corresponding to the maximal rate of precipitation.

Another requirement to be met by the production of trouble-free epitaxial layers is to provide for extreme purity of the substrate surface upon which the monocrystalline layer is to be precipitated. It has been surprisingly found by experimentation that this requirement can be satisfied the more easily, the higher the temperature of the carrier surface is chosen.

According to my invention, therefore, the precipitation is effected at a temperature at or above the temperature of maximal precipitation. This method is particularly important because the substrate wafers are often very highly doped, having specific resistances higher than 0.1 ohm-cm. and, under these conditions, any surface disturbances will cause faults in the epitaxially grown layer.

The heating of the substrates to the high temperature required by the invention can be effected in different ways:

(a) By passing electric current directly through the substrates;

(b) By placing the substrates onto a heated support, for example a graphite tape;

(c) By heating with the aid of a radiator, for example through the quartz wall of the reaction vessel, which affords keeping the reaction space free of any heater bodies and metallic current leads;

(d) By eddy-current heating with the aid of high-frequency induction.

In the latter case, the method of operating above the temperature of maximal precipitation rate exhibits the following particular advantages:

Due to the skin effect of the eddy currents, which are induced at the surface of the substrate and heat the substrate, the heating power active at the substrate surface is further increased so that any protruding parts of the substrate surface are necessarily heated to a higher temperature than the normal substrate surface or, particularly, any recesses in the surface. Since the operation takes place within a range of the precipitation characteristic in which the precipitation of semiconductor material decreases with increasing temperature, the irregularities of the substrate surface can thus be healed without difficulty.

Since furthermore the diffusion of impurities or doping substances contained in the substrate takes place in accordance with the temperature gradient, a migration of foreign substances away from the surface of the substrate toward the interior will occur. This reduces the diffusion of foreign substances from the interior of the substrate into the precipitated layer. A prerequisite for heating substantially only the surface of the substate is the selection of a sufficiently high frequency of the heating current so that the skin effect is utilized even if the substrate material has a relatively high specific resistance.

The surface of the substrate may also be heated by additional irradiation with light having wave lengths below the absorption edge, so that the temperature of the surface rises somewhat above the interior temperature of the substrate body.

This manner of additionally heating the surface in the epitaxial process according to the invention results in novel processing possibilities, as will appear from the following.

In the first place, selected limited areas on the substrate surface can be heated by optical means above the median temperature of the substrate. This permits obtaining at the more highly heated localities a precipitation of less or no material, without the necessity of using a mask of foreign material. The presence of foreign materials in the vicinity of the layer to be precipitated, always poses the danger of contaminating the semiconductor and the grown layer. The processing mode just mentioned avoids such trouble and affords the production of patterns and figures as required in the multiple production of transistor systems and solid-state integrated circuits.

Since the operation takes place on the descending branch of the precipitation characteristic, the light radiated upon selected areas of the substrate surface has the effect of additionally reducing the precipitation rate or even to promote the dissolution of the base material due to the additional quantum energy of the incipient light which, as mentioned above, is located above the dissociation energy (absorption edge).

In a specific example of the method according to the invention, there has been employed a substrate body doped to a specific resistance lower than 0.1 ohm-cm., preferably 0.01 ohm-cm. It should be understood, however, that the method of the invention may also be performed with substrates which are more highly doped up to the degeneration concentration so as to possess virtually metallic conductivity.

Applicable as carrier gas is a gas which reacts with the gaseous semiconductor compound to be used. Preferably used for this purpose is hydrogen. Other gases, such as argon and other inert gases not participating in the conversion of the gaseous semiconductor material are likewise suitable in a similar manner. The maximum of the semiconductor precipitation curve, which depends upon temperature, can be adjusted by the selection of the molar ratio of semiconductor compound to active carrier gas, or also by varying the molar ratio during the course of the conversion.

The configuration of the precipitation curve may also be varied by providing the reaction mixture with an addition of another gaseous component that does not participate in the conversion and has a molar weight larger than that of hydrogen, preferably a multiple of that rate. For example, argon may thus be added to hydrogen.

The addition of such a component further permits increasing the gaseous components beyond the generally customary share to relatively higher value. Thus, in the case of silicon the molar ratio of semiconductor compound to hydrogen can be increased to a value higher than 0.2, preferably to 0.3 to 2.

Applicable as substrates are wafers in the shape of a circular disc or rectangular plate, or structures having the shape of wire or tape.

The semiconductor material produced in accordance with the method of the invention is suitable for the production of various electronic semiconductor components such as transistors, rectifiers and the like.

The invention will be further elucidated with reference to embodiments described hereinafter in conjunction with the accompanying drawings in which.

Figure 1:
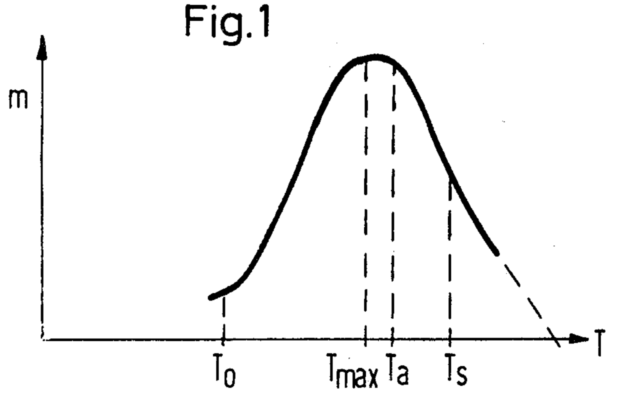
FIG. 1 shows the precipitation characteristic of a reaction gas mixture suitable for the method according to the invention.

The graph according to FIG. 1 represents the precipitation charactertistic of a reaction gas mixture suitable for the method according to the invention. Indicated along the ordinate is the quantity of the semiconductor material precipated upon a unit area (cm.$^2$) of substrate surface per minute. The abscissa indicates the temperature at the substrate surface. The precipitation of semiconductor material and hence the growth of the epitaxial layer on the substrate surface commences at the temperature $T_0$ and increases with increasing temperature up to a maximal precipitation rate at the temperature $T_{max}$. As the temperature further increases, the quantity of precipitating semiconductor material per unit time decreases at an increasing rate. Under suitable operating conditions there may even occur a dissolution of substrate material along the descending branch of the precipitation characteristic at temperatures above $T_{max}$. Particularly of interest for the method according to the invention is the range between $T_{max}$ and the melting temperature $T_s$ of the semiconductor material.

A precipitation corresponding to the one exemplified in FIG. 1 is achieved particularly when employing gaseous halogen compounds or halogen-hydrogen compounds of the semi-conductor materials being employed. The position of the maximum $T_{max}$ depends upon the composition of the reaction gas mixture. If, for example, hydrogen is used as a carrier gas, then $T_{max}$ depends to a great extent upon the hydrogen content of the reaction gas. Thus, a reaction gas mixture composed of 5 mole percent $SiHCl_3$ and 95 mole percent hydrogen leads to a maximal rate of precipitation at a temperature of 1400° C. The quantity of silicon precipitating at this temperature also depends upon the gas pressure, and at normal atmospheric pressure amounts to about 2 mg. silicon per minute and per cm.$^2$ at the substrate surface. If a molar ratio of 7% $SiHCl_3$ and 93% hydrogen is used, the temperature $T_{max}$ of maximal precipitation lies considerably above the melting point of silicon. On the other hand, the maximal precipitation of silicon can be obtained at a temperature as low as 1100° C., if a reaction gas mixture of 2 mole percent $SiHCl_3$ and 98% hydrogen is chosen. If $SiCl_4$ is employed in lieu of $SiHCl_3$, the conditions as to temperature and composition are similar, but the quantity of the silicon precipitating per unit time at the same gas pressure and the same temperature is smaller than with $SiHCl_3$. The use of other halogen-hydrogen compounds, such as $SiH_2Cl_2$ or $SiH_3Cl$, requires a slight change in the above-mentioned molar ratios. Analogous conditions obtained when using other semiconductor materials in lieu of silicon.

Figure 2:
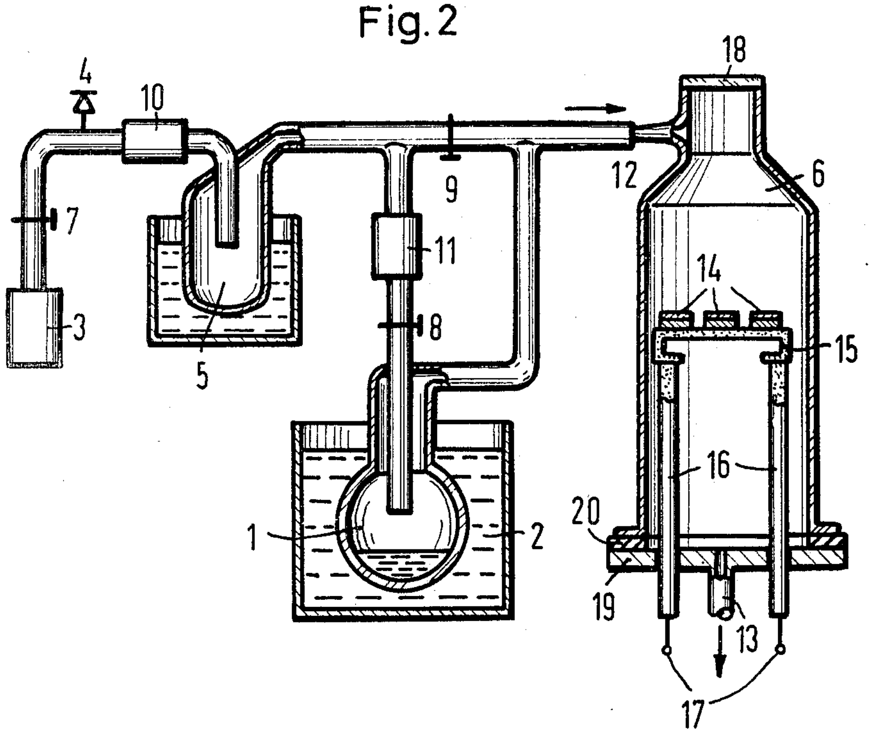
FIG. 2 shows schematically and partly in section an example of equipment for producing epitaxial layers on substrate wafers according to the invention.

The equipment illustrated in FIG. 2 serves to produce epitaxial layers on substrates constituted by flat discs, platelets or wafers. An evaporator vessel 1 is mounted in a temperature controlled heating bath 2 and contains a liquid silicon-halogen compound. Hydrogen passes from a storage vessel 3 through a pressure-reduction valve 7, an over-pressure valve 4 and a cooling trap 5 into the evaporator 1 where it becomes mixed with evaporated semiconductor compound. The mixture passes into a reaction vessel 6 of quartz. The mixing ratio of the gaseous components can be adjusted and varied by means of valves 7, 8 and 9. The quantity of the evaporated silicon compound may also be controlled and varied by correspondingly selecting the temperature of the bath 2 which is kept constant by suitable regulation.

The reaction gas mixture, entering through an inlet 12 into the reaction vessel 6, is subjected to the reaction and precipitation process, and the remaining gases leave the vessel through an outlet 13. The dissociation and conversion of the reaction gas take place on the semiconductor substrates 14 which are placed on top of a heated support 15 of inert material. The support 15, constituting an electrical heating resistor, has its ends connected with respective conductor rods 16 which extend out of the vacuum vessel in gas-tightly sealed relation thereto and are connected to external terminals 17 for supply of heating current. The temperature of the substrates 14 is pyrometrically observable through a ground, planar quartz plate 18 closing the top of the reaction vessel. The bottom of the reaction vessel is formed by a metal base 19 joined with the quartz portion of the vessel and sealed by a gasket 20 of synthetic material.

Referring, for example, to monocrystalline substrates of silicon, the reaction gas mixture, composed for example of 2 mole percent $SiHCl_3$ and 98 mole percent hydrogen, is dissociated in the reaction vessel 6 at the surface of the substrates 14 heated to a temperature of 1250° C. The precipitating silicon causes the growth of an epitaxial layer on each substrate. At this temperature, any oxide residues on the surface of the silicon substrates are removed by reaction with the silicon present, thus forming gaseous SiO which leaves the reaction vessel together with the residual gases.

According to a modification of this method, the surface of the substrates is heated at local spots, or in accordance with any other predetermined pattern, to a temperature considerably above the temperature obtaining at other localities of the substrate surface. In this manner it can be achieved, for example, that predetermined limited areas of the substrate surface are so highly heated that only little or no silicon is precipitated upon these areas on account of the descending precipitation characteristic. The necessary excess heating at these localities is produced, for example, by radiation concentrated with the aid of optical devices. The areas to which the higher temperature is thus applied then exhibit recesses in comparison with the remaining surface portions on which normal precipitation takes place. Such recess formation by optical heating is exemplified in FIG. 3.

Figure 3:
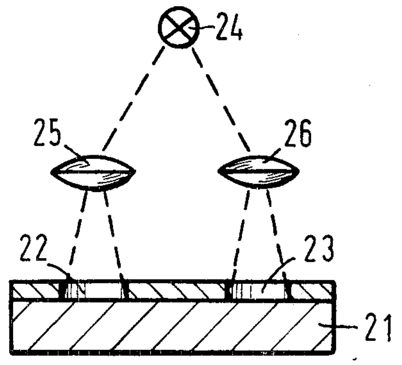
FIG. 3 illustrates schematically the provision of additional heating means for applying optical radiation to selected areas of the substrate surface.

By the means and in the manner described with reference to FIG. 2 the semiconductor substrate 21 shown in FIG. 3 is heated to the above-mentioned temperature of 1250° C. The surface areas 22 and 23, however, are additionally heated from a radiation source 24 furnishing a wave length smaller than, or equal to, the wave length of the absorption edge ($\sim 1\mu$), thus raising the temperature in the areas 22 and 23 up to 1350° C. The source 24 may consist of a laser so as to furnish monochromatic high-intensity radiation. Optical means, such as the schematically illustrated lenses 25 and 26, are provided for obtaining a concentration of the high-energy radiation upon the selected areas. The radiation may be effected from the outside through the planar quartz plate 18 (FIG. 2).

Figure 4:
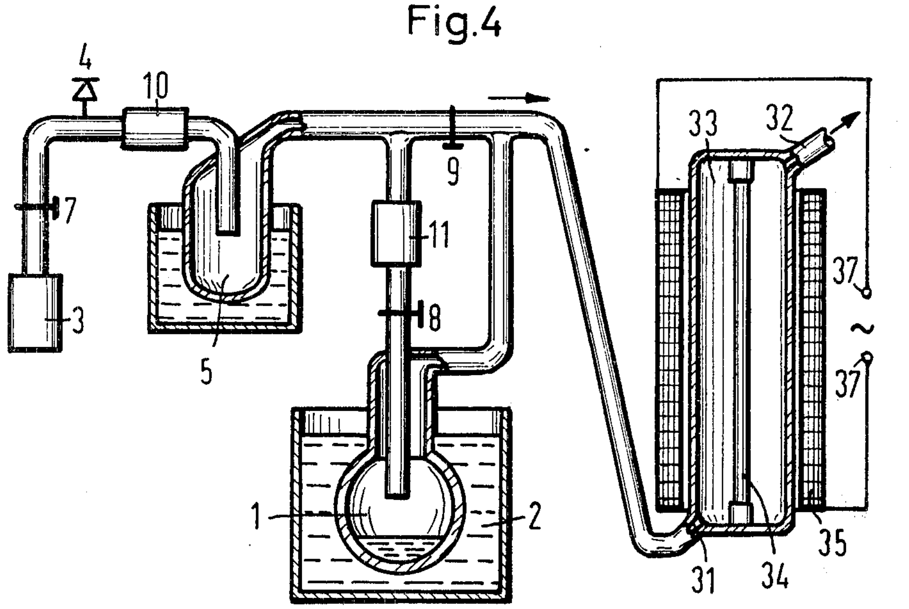
FIG. 4 shows another example, partly in section, of equipment suitable for performing the method of the invention.

The example of equipment illustrated in FIG. 4 is particularly suited for growing epitaxial layers on filamentary substrates such as wires or tapes. The reaction gas is produced as described above with reference to FIG. 2. The gaseous mixture passes through the inlet opening 31 into the reaction vessel 33 consisting of quartz and possessing an outlet 32 for the residual gases. A rod-shaped or tape-shaped substrate 34 is clamped at both ends so as to be kept in substantially taut condition. An axially elongated induction coil 35 surrounding the tubular vessel 33 serves to heat the substrate 34 and has terminals 37 for connection to a high-frequency generator.

Referring to a substrate 34 of monocrystalline silicon, the process is performed, for example, by heating the substrate to a temperature of about 1200° C. The reaction gas mixture entering through the inlet opening 31 and consisting for example of 2 mole percent $SiCl_4$ and 98 mole percent hydrogen is dissociated on the heated substrate, and the precipitating silicon grows on the substrate surface as a uniform monocrystalline layer. The substrate used may have an electrical specific resistance of 0.01 ohm-cm., whereas the grown epitaxial layer has a specific resistance of about 1–1000 ohm-cm.

The above-described methods may be performed by employing a substrate whose type of conductance is opposed to that of the precipitating layer. The gas pressure in the reaction vessel is preferably about 1 atmosphere. The flow rate of the reaction gas is preferably adjusted to approximately 10 liters per minute.

The resulting semiconductor layers are suitable for the production of virtually any semiconductor components requiring high-quality or monocrystalline semiconductor layers or films. Embodiments of equipment as exemplified by FIG. 3 and described above also permit a relatively simple production of solid-state integrated circuits.

It will be obvious that a doping substance in gaseous form, such as a halogen compound of the dopant, may also be added to the reaction gas in order to precipitate doped epitaxial layers, thus permitting giving these layers any desired type and value of electrical conductance. Upon a study of this disclosure, further variations of the method and modifications of equipment for performing the method of the invention will be obvious to those skilled in the art, and it will be understood that the invention may be given embodiments other than particularly illustrated and described herein, without departing from the essential features of my invention and within the scope of the claims annexed hereto.

I claim:

1. In the method of producing pure silicon and other semiconductor material for electronic purposes by precipitating it from a reaction gas comprising a mixture of gaseous compound of a semiconductor element and carrier gas upon a substrate having its crystalline structure laid bare and having its surface contacted by the flowing gas mixture in a processing vessel whose walls are kept at a lower temperature than said substrate, the improvement which comprises the steps of providing a substrate having a specific electric resistance of at most 0.1 ohm-cm., heating said substrate by high frequency inductive heating to a temperature below the melting point of the semiconductor element yet sufficiently high to effect deposition of the semiconductor element from the gas phase onto the surface of the substrate; and adjusting the composition of the reaction gas so that throughout the deposition process the temperature at which the rate of deposition is at a maximum is below the temperature to which the surface of the substrate is heated, and the temperature to which the surface of the substrate is heated lies in a temperature range wherein the rate of deposition decreases with increasing temperature at a constant rate.

2. The method according to claim 1, which comprises additionally heating the substrate by radiation from the outside of said vessel.

3. The method according to claim 1, wherein said substrate is doped and has a specific electric resistance of approximately 0.01 ohm-cm.

4. The method according to claim 1, wherein said carrier gas is selected from the group consisting of reducing and inert gases.

5. The method according to claim 1, wherein said carrier gas is reactive relative to said gaseous semiconductor compound, and wherein the maximum precipitation is adjusted by correspondingly selecting the molar ratio of compound gas to carrier gas.

6. The method according to claim 5, which comprises changing the maximum precipitation during progress of the method by varying said molar ratio.

7. The method according to claim 1, wherein said carrier gas is hydrogen and which comprises the step of adding to the reaction gas mixture another gaseous component inactive as regards the reaction and having a higher molar weight than hydrogen.

8. The method according to claim 7, wherein said added component is argon.

9. The method according to claim 1, wherein said substrate is a wafer.

10. The method according to claim 1, wherein said substrate has axially elongated filamentary shape.

11. The method according to claim 1, which comprises heating selected area portions of the substrate surface in accordance with a given pattern.

12. The method according to claim 11, wherein said patternwise heating is effected by radiation in addition to the heating required for attaining said reaction temperature.

13. The method according to claim 12, which comprises optically concentrating said radiation on said area portions.

14. The method according to claim 12, wherein the radiation is concentrated by optical lenses.

15. The method according to claim 11, wherein said patternwise heating is effected by laser radiation.

References Cited

UNITED STATES PATENTS

| | | | |
|---|---|---|---|
| 3,047,438 | 7/1962 | Marinace | 148—175 |
| 3,146,123 | 8/1964 | Bischoff | 117—106 |
| 3,151,006 | 9/1964 | Grabmaier et al. | 148—174 |
| 3,173,814 | 3/1965 | Law | 148—175 |
| 3,192,083 | 6/1965 | Sirtl | 148—175 |
| 3,200,018 | 8/1965 | Grossman | 148—174 XR |
| 3,208,888 | 9/1965 | Ziegler et al. | 148—175 |
| 3,271,208 | 9/1966 | Allegretti | 148—175 |
| 3,297,501 | 1/1967 | Reisman | 148—174 XR |
| 3,354,004 | 11/1967 | Reisman et al. | 148—174 XR |
| 3,364,087 | 1/1968 | Soloman et al. | 156—17 XR |

L. DEWAYNE RUTLEDGE, Primary Examiner

R. A. LESTER, Assistant Examiner

U.S. Cl. X.R.

117—107.2; 156—17